(12) United States Patent
Matsumura et al.

(10) Patent No.: US 6,740,565 B2
(45) Date of Patent: May 25, 2004

(54) PROCESS FOR FABRICATION OF A SIMOX SUBSTRATE

(75) Inventors: Atsuki Matsumura, Futtsu (JP); Tsutomu Sasaki, Futtsu (JP); Koichi Kitahara, Futtsu (JP)

(73) Assignee: Nippon Steel Corporation, Tokyo (JP)

( * ) Notice: Subject to any disclaimer, the term of this patent is extended or adjusted under 35 U.S.C. 154(b) by 0 days.

(21) Appl. No.: 10/296,858
(22) PCT Filed: Mar. 28, 2002
(86) PCT No.: PCT/JP02/03128
§ 371 (c)(1), (2), (4) Date: Nov. 26, 2002
(87) PCT Pub. No.: WO02/080277
PCT Pub. Date: Oct. 10, 2002

(65) Prior Publication Data
US 2003/0170940 A1 Sep. 11, 2003

(30) Foreign Application Priority Data
Mar. 28, 2001 (JP) .......................... 2001-93228

(51) Int. Cl.$^7$ .............................. H01L 21/76
(52) U.S. Cl. .......................... 438/407; 438/404
(58) Field of Search ................. 438/407, 423, 438/514, 400, 404, 480, 479, 530, 526, 184

(56) References Cited

U.S. PATENT DOCUMENTS

2002/0022348 A1 * 2/2002 Sakaguchi et al. .......... 438/480
2003/0008435 A1 * 1/2003 Falster et al. ............... 438/149

FOREIGN PATENT DOCUMENTS

| EP | 675 534 A2 | 10/1995 |
| EP | 704 892 A2 | 4/1996 |
| EP | 966 034 A1 | 12/1999 |
| JP | 58-56344 | 4/1983 |
| JP | 62-202528 | 9/1987 |
| JP | 9-64320 | 3/1997 |
| JP | 2000-281490 | 10/2000 |
| JP | 2000-344598 | 12/2000 |

OTHER PUBLICATIONS

F. Vettese, et al., "Electrical properties of oxygen thermal donors in silicon films synthesized by oxygen implantation", J. Appl. Phys. vol. 65, No. 3, Feb. 1, 1989, pp. 1208–1212.
"Physics of semiconductor Devices ($2^{nd}$ Ed.)" by S.M. Sze, J. Wiley & sons, Inc., p. 32, 1981.
"Silicon Science" chp. 7, Sic. 3 by USC JSTRS, pp. 540–546.
"Oxygen, Carbon, Hydrogen & Nitrogen in Crystalline Silicon", pp. 19–30, Materials Research Society, 1986.

* cited by examiner

Primary Examiner—Richard Elms
Assistant Examiner—Brad Smith
(74) Attorney, Agent, or Firm—Kenyon & Kenyon

(57) ABSTRACT

There is provided a process for fabrication of a SIMOX substrate wherein oxygen ions are implanted into a single crystal silicon substrate and then subjected to a high-temperature heat treatment to form a buried oxide layer and a surface single crystal silicon layer, wherein the single crystal silicon substrate used has a mean resistivity of 100 Ωcm or greater, and there is conducted a step of maintaining a temperature of from 800° C. to 1250° C. for a predetermined time in the final stage of the high-temperature heat treatment, as well as a SIMOX substrate wherein the mean resistivity of the substrate obtained by the process is 100 Ωcm or greater.

6 Claims, 4 Drawing Sheets

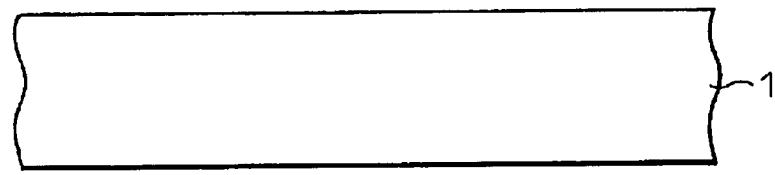
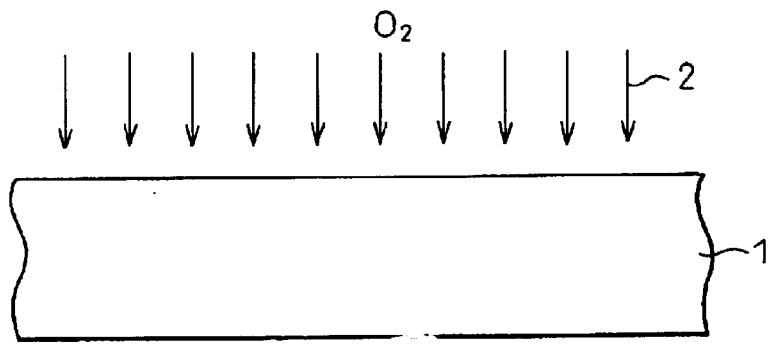
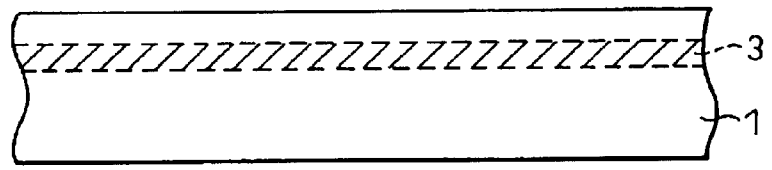
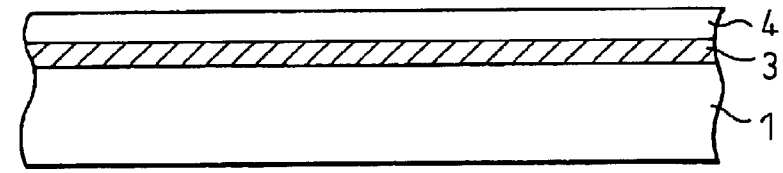

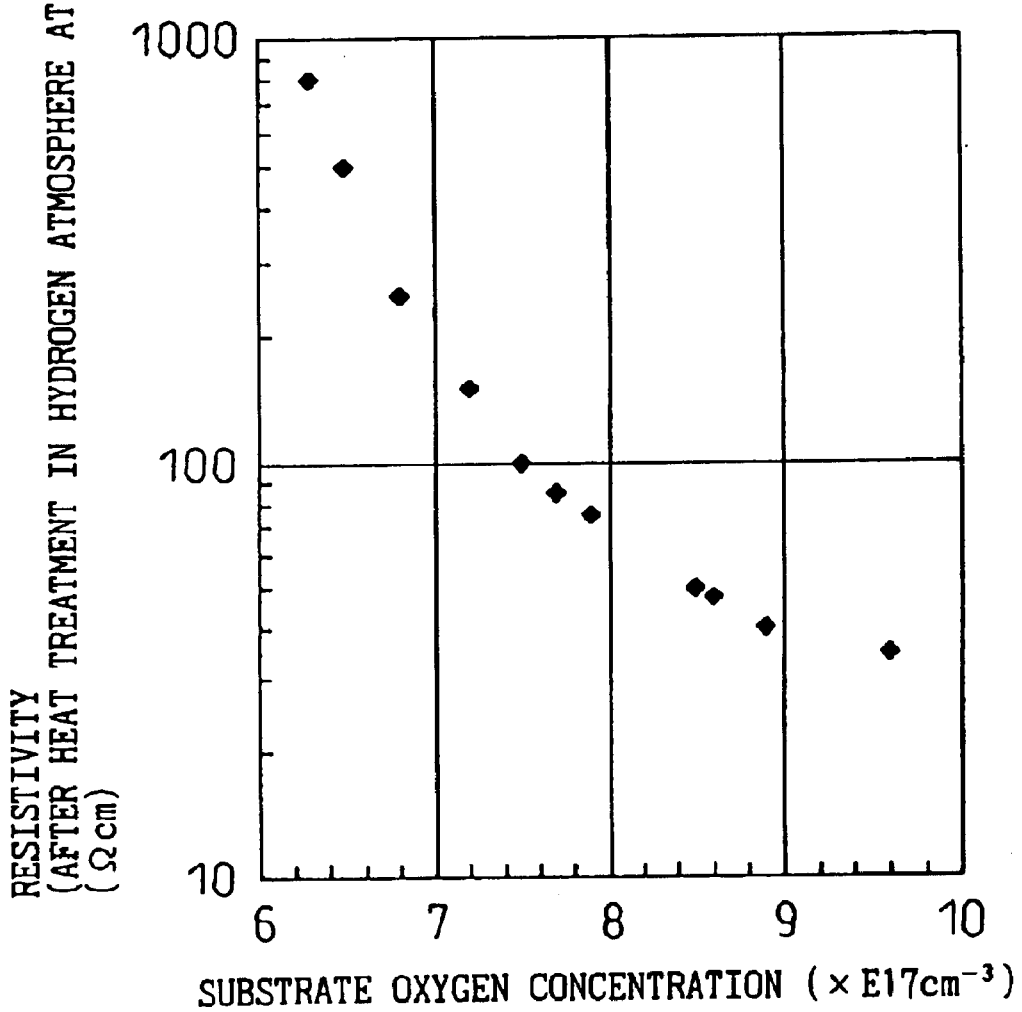

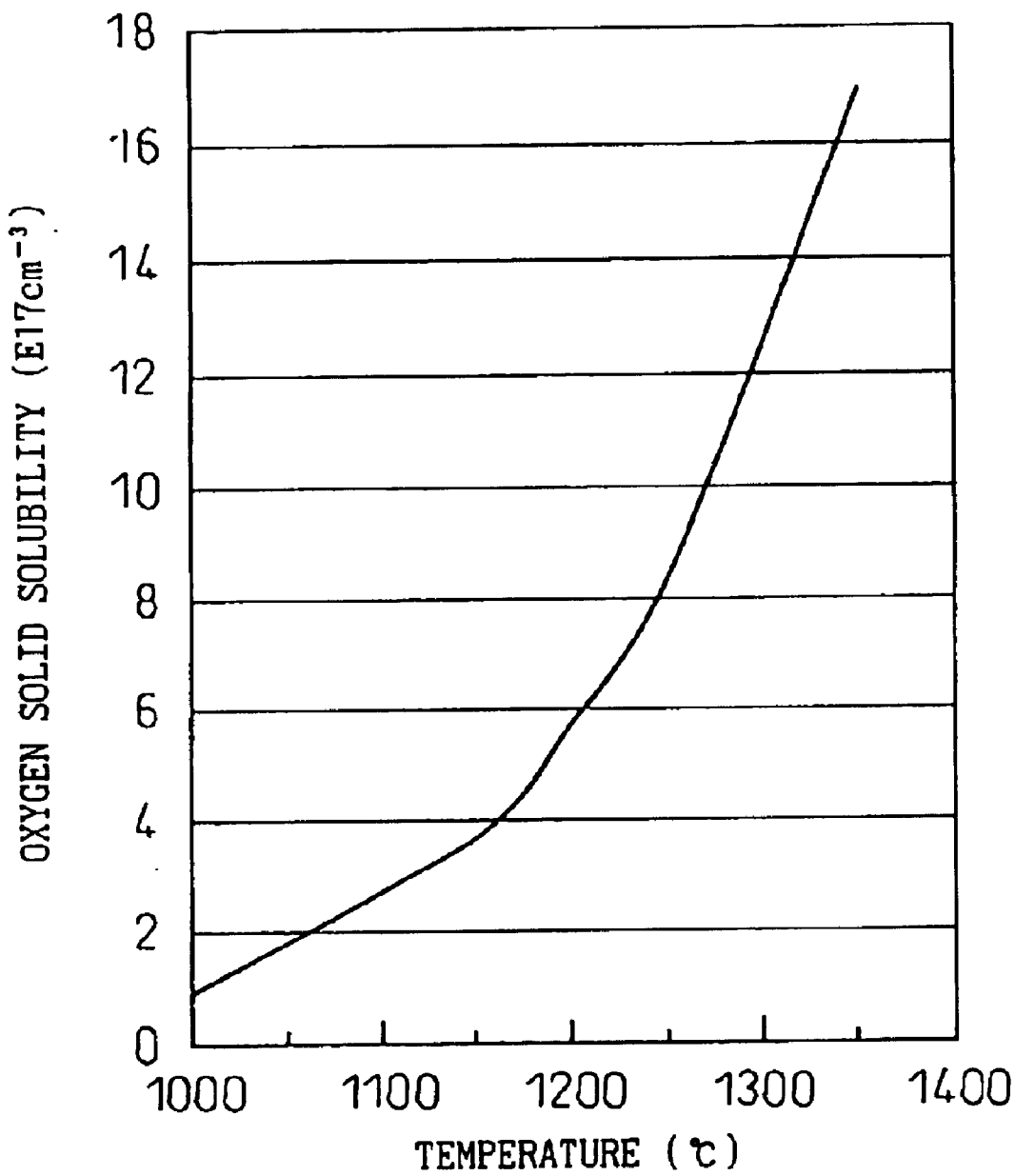

PROCESS FOR FABRICATION OF A SIMOX SUBSTRATE

TECHNICAL FIELD

The present invention relates to an SOI substrate comprising an oxide layer buried near the surface of a silicon substrate, with a single crystal silicon layer (hereinafter referred to as SOI (Silicon-On-Insulator) layer) formed thereover. More specifically, it relates to a process for fabrication of an SOI layer by SIMOX (Separation by Implanted Oxygen) technology.

BACKGROUND ART

SIMOX wafers and bonded SOI wafers are known as the primary types of SOI wafers that have single crystal silicon layers formed on insulators such as silicon oxide. SIMOX wafers are SOI wafers obtained by implanting oxygen ions into a single crystal silicon substrate by implantation of oxygen ions, and subsequently performing annealing treatment for chemical reaction between the oxygen ions and silicon atoms to form a buried oxide layer. Bonded SOI wafers, on the other hand, are SOI wafers obtained by bonding two single crystal silicon substrates, one of which is oxidized but the other is not, and thinning one of the two wafers.

Among such SOI wafers, SIMOX wafers are characterized by especially excellent layer thickness uniformity because the SOI layer thickness can be controlled by the oxygen ion implantation depth. In a SIMOX wafer, the SOI layer can be formed to a thickness of 0.3 $\mu$m or smaller, and satisfactory thickness control can even be achieved with SOI layers of approximately 0.1 $\mu$m thickness or smaller. In particular, SOI layers with thicknesses of 0.1 $\mu$m and smaller are generally applied for formation of fully depleted MOS-LSIs, where the film thickness of the SOI layer itself is directly proportional to the threshold voltage for the MOS-FET operation; the SOI layer thickness uniformity is therefore an important quality for high-yield fabrication of high-performance devices. From this standpoint, SIMOX wafers with excellent SOI layer thickness uniformity are promising as next generation MOSFET wafers.

Since a MOS-LSI fabricated on a SOI substrate is electrically insulated from the substrate body in the device-formed region by a buried oxide layer as the insulator, it is possible to achieve excellent characteristics including improved radiation resistance or latch-up resistance, low power consumption operation and super-high speed operation. As disclosed in Japanese Unexamined Patent Publication HEI No. 9-64320, electrically separating the device-formed region from the substrate can reduce the effect of the junction capacitance between the device-formed region and the substrate, thereby providing an advantage for high-speed devices such as baseband processors.

Japanese Unexamined Patent Publication HEI No. 9-64320 proposes increasing the resistivity value of the support substrate of the SOI substrate to 50 $\Omega$cm or greater, as a technique for further improving the characteristics of a super-high frequency device formed on the SOI substrate. It is explained that the SOI substrate is produced by a "bonding method" whereby a high-resistance single crystal silicon substrate manufactured by a floating zone method is used on the support substrate side and a low-resistance single crystal silicon substrate manufactured by the Czochralski process is used on the device-formed side, and bonding is performed after thermally oxidizing each of the surfaces to form oxide films of the desired thickness, after which the silicon substrate on the device-formed side is polished to a desired thin thickness.

Although the high-resistance support substrate for the bonded SOI substrate proposed in Japanese Unexamined Patent Publication HEI No. 9-64320 can be easily manufactured by the aforementioned floating zone system, this type silicon substrates contain no oxygen, and therefore their mechanical strength is insufficient, slip tends to occur, and it is difficult to fabricate large-diameter substrates with diameters of 8 inches (200 mm) or greater.

Moreover, polishing of the silicon layer to serve as the device-formed section in an SOI substrate obtained by a bonding method results in deterioration of the film thickness uniformity, such that silicon layer thicknesses of about 0.1 $\mu$m cannot be formed with satisfactory layer thickness uniformity.

In attempting to solve the former problem, utilization of single crystal silicon substrates by the Czochralski process can be considered. A single crystal silicon substrate obtained by the Czochralski process has excellent mechanical strength due to an oxygen concentration of approximately $10^{18}$ cm$^{-3}$, while large-diameter substrates of 8 inches (200 mm) and larger can also be manufactured. Furthermore, by adjusting the impurity addition during crystal growth it is possible to manufacture a single crystal silicon substrate with a resistivity of 100 $\Omega$cm or greater. (For discussion on the relationship between resistivity and impurity concentration in silicon substrates, see, for example, "Physics of Semiconductor Devices (2nd Edition)" ed. by S. M. Sze, (1981), John Wiley & Sons, Inc., p.32.)

In attempting to solve the latter problem, fabrication of SOI substrates by the SIMOX process has been considered. In the SIMOX process, the SOI structure is formed by oxygen ion implantation and high-temperature heat treatment, but since the oxygen implantation depth can be controlled by the ion acceleration energy, it is characterized by giving excellent layer thickness uniformity of the SOI structure obtained after high-temperature heat treatment, thereby allowing manufacture of silicon layers with satisfactory layer thickness uniformity even with thicknesses of around 0.1 $\mu$m.

However, since single-crystal silicon substrates obtained by the Czochralski process contain trace amounts of oxygen, heat treatment at relatively low temperatures of about 500° C., which is employed for sintering or the like after Al interconnect formation in device fabrication steps, results in generation of a thermal donor (or oxygen donor) and lowers the resistivity of the substrate to a level of about 10 $\Omega$cm. (Thermal donors are discussed, for example, in "Silicon Science", Chapter 7, Section 3, edited by the USC Japan Semiconductor Technology Research Society.) In order to reduce this effect it is necessary to reduce the oxygen content of the silicon crystals, but because the molten silicon melt is retained in a quartz crucible in the Czochralski process, it is impossible to completely avoid dissolution of oxygen from quartz into the silicon melt, such that a natural limit exists for the range of reducing the oxygen concentration in the crystals. Consequently, when using a silicon substrate according to the ordinary Czochralski process, a reduction in the resistivity occurs due to the thermal donor after heat treatment at low temperature even if the resistivity is high immediately after fabrication of the substrate, such that the high resistivity cannot be maintained.

Moreover, since oxidation, or heat treatment corresponding to oxidation, is carried out at a high temperature of 1300°

C. or greater in most cases in the SIMOX process, the oxygen solubility limit in the silicon substrate increases in response to the treatment temperature. Thus, the oxygen concentration of the substrate after SIMOX fabrication increases even when the oxygen concentration of the substrate material is drastically lowered, creating a problem in that reduction in the resistivity due to thermal donor generation cannot be avoided during low-temperature heat treatment in the device manufacturing steps.

The present invention overcomes these problems associated with SOI substrates with high-resistivity silicon substrates and their manufacturing methods, by providing higher quality high-resistivity SOI substrates.

SUMMARY OF THE INVENTION

The present inventors have newly discovered that by carrying out a step of maintaining a temperature of from 800° C. to 1250° C. for a minimal predetermined time in the final stage of high-temperature heat treatment following oxygen ion implantation during fabrication of an SOI substrate by the SIMOX process using a single crystal silicon substrate with high resistivity, it is possible to lower the oxygen concentration in the substrate which has increased during the high-temperature heat treatment, and thus maintain high resistivity even after low-temperature heat treatment in the subsequent device manufacturing steps. In other words, the present invention relates to an SOI substrate and fabrication process therefor which solve the aforementioned problems by way of the following means.

Specifically, the invention provides a process for fabrication of a SIMOX substrate wherein oxygen ions are implanted into a single crystal silicon substrate and then subjected to high-temperature heat treatment to form a buried oxide layer and a surface single crystal silicon layer, the process being characterized in that the single crystal silicon substrate used has a mean resistivity of at least 100 Ωcm and no greater than the intrinsic resistivity of the single crystal silicon, and there is a step of maintaining a temperature of from 800° C. to 1250° C. for a prescribed time in the final stage of high-temperature heat treatment.

Preferably, the aforementioned SIMOX substrate fabrication process is characterized in that a temperature of from 800° C. to 1200° C. is maintained in the final stage of high-temperature heat treatment.

More preferably, the aforementioned SIMOX substrate fabrication process is characterized in that the temperature is maintained for a period of 4 hours or longer in the final stage of high-temperature heat treatment.

The aforementioned SIMOX substrate fabrication process is also preferably characterized in that the single crystal silicon substrate is manufactured by the Czochralski process.

Preferably, the aforementioned SIMOX substrate fabrication process is characterized in that the single crystal silicon substrate used has a mean resistivity of at least 500 Ωcm and no greater than the intrinsic resistivity of the single crystal silicon.

The SIMOX substrate is preferably a SIMOX substrate fabricated by the process as described above, and is characterized in that the mean resistivity of the substrate section after low-temperature heat treatment of the SIMOX substrate is at least 100 Ωcm and no greater than the intrinsic resistivity of the single crystal silicon.

More preferably, the SIMOX substrate is a SIMOX substrate fabricated by the process as described above, and is characterized in that the mean resistivity of the substrate section after low-temperature heat treatment of the SIMOX substrate is at least 500 Ωcm and no greater than the intrinsic resistivity of the single crystal silicon.

BRIEF DESCRIPTION OF THE DRAWINGS

FIGS. 1A to 1E illustrate a process for fabrication of a SIMOX substrate from a silicon substrate, and manufacture of a semiconductor device.

FIG. 2 is a graph showing the relationship between substrate oxygen concentration and substrate resistivity after hydrogen sintering.

FIG. 3 is a graph showing the oxygen solid solubility of a silicon substrate at different heat treatment temperatures.

PREFERRED EMBODIMENT OF THE INVENTION

Figure 1E:
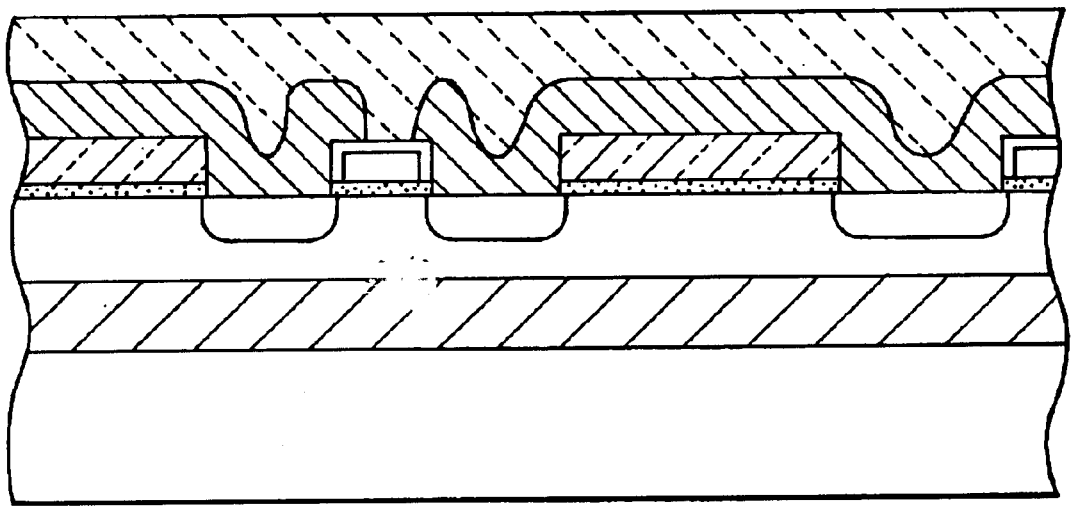

The present invention will now be explained in further detail.

The present invention relates to a high-resistance SOI substrate with a high resistivity support substrate, wherein the SOI substrate has a semiconductor layer formed on the support substrate via an insulating layer. A single crystal silicon substrate with high resistivity is used as the substrate material and an SOI substrate is fabricated by the SIMOX process.

The fabrication steps for a SOI substrate by the SIMOX method will now be explained in brief with reference to FIGS. 1A to 1D. A single crystal silicon substrate 1 fabricated by the Czochralski process, shown in FIG. 1A, is implanted with oxygen ions 2 from above the silicon substrate 1 in a high electric field as shown in FIG. 1B, and a high oxygen concentration layer 3 is formed inside the silicon substrate 1 as shown in FIG. 1C. Next, the silicon substrate 1 is heat treated, to form an SOI substrate comprising the silicon substrate 1, the buried oxygen layer 3' and a silicon layer 4 above it thereon (FIG. 1D). The SOI substrate is then subjected to a semiconductor fabrication step utilizing the silicon layer 4 on the buried oxide layer 3 and forming a interconnection layer 5 thereover, to manufacture a transistor or other semiconductor element or semiconductor circuit (FIG. 1E).

The single crystal silicon substrate serving as the material need only be one which can give the prescribed high resistivity, and its conduction type may be either P-type or N-type. There are also no particular restrictions on the type of dopant introduced, and typically boron is used as a P-type dopant while phosphorus, arsenic or antimony are used as N-type dopants. The single crystal silicon manufacture method may be either the Czochralski process or floating zone process, but the Czochralski process is preferred from the standpoint of mechanical strength of the substrate. There are no particular restrictions on the manufacturing conditions for the single crystal silicon, such as the crystal pulling rate for the Czochralski process, or the thermal history. A magnetic field may be applied to the silicon melt during crystal growth in the Czochralski process. The oxygen concentration of the substrate is also not particularly restricted.

The resistivity of the substrate is preferably at least 100 Ωcm and no greater than the intrinsic resistivity of the single crystal silicon, and more preferably at least 500 Ωcm and no greater than the intrinsic resistivity of the single crystal silicon, in order to obtain satisfactory high-frequency characteristics for the device formed thereover. Single crystal silicon having such resistivity can be produced by adjusting the amount of dopants added during crystal growth, as mentioned above.

There are no particular restrictions on the oxygen ion implantation in the SIMOX substrate fabrication conditions. The oxygen ion dose may be either a low dose or high dose, or otherwise as desired. A low dose is a dose whereby the buried oxide film is first formed upon high-temperature heat treatment at 1300° C. or above after oxygen implantation, and a high dose is a dose whereby the buried oxide film is formed after oxygen implantation without such high-temperature heat treatment. The dose ranges are functions of the respective implantation energies and, in the case of multiple implantation, they depend on each implantation temperature and dose; for example, in the case of 180 keV implantation, a low dose is usually in the range of about $3.5 \times 10^{17}$ to about $4.5 \times 10^{17}$ ions/cm$^2$, and for the same 180 keV implantation, a high dose is usually in the range of about $1.3 \times 10^{18}$ ions/cm$^2$ or greater. The oxygen ion implantation may also be carried out in multiple separate stages. The substrate temperature during oxygen ion implantation is preferably about 500–600° C. from the standpoint of in-situ recovery but this is not particularly restrictive. The apparatus used for oxygen ion implantation need only be able to apply a voltage to the oxygen ions for acceleration and then implant them through the silicon substrate surface, and there are no particular restrictions on the form of apparatus, ion implantation system, etc.

The high-temperature heat treatment conditions employed following the oxygen ion implantation are not particularly restricted except for the final stage as specified by the invention, but from the standpoint of removing damage to the crystals caused by the oxygen ion implantation, the heat treatment is preferably conducted at a high temperature of 1300° C. or above. There are also no particular restrictions on the atmosphere for heat treatment, and it may be an inert gas such as argon or nitrogen, or alternatively oxygen, hydrogen or a mixed gas of argon/oxygen or nitrogen/oxygen. Internal oxidation treatment may also be carried out by increasing the oxygen partial pressure during heat treatment.

According to the invention, a temperature of from 800° C. to 1250° C. must be maintained for a prescribed period of time at the final stage of the high-temperature heat treatment, for the following reason. As mentioned above, the resistivity of the silicon substrate varies depending on the thermal donor generated during low-temperature heat treatment. The present inventors investigated the relationship between silicon substrate oxygen concentration and resistivity of the substrate after treatment for 1 hour in a hydrogen atmosphere at 450° C., where the substrate was a single crystal silicon substrate with an oxygen concentration of $6.0–10.0 \times 10^{17}$ atoms/cm$^3$ (calculated using the oxygen concentration conversion factor by the Japan Electronic Industry Development Association) and a resistivity of about 1000 Ωcm before heat treatment. As shown by the results in FIG. 2, it was confirmed that increasing oxygen concentration leads to greater thermal donor generation during the low-temperature heat treatment, and therefore reduced substrate resistivity. Based on these results, an oxygen concentration of $7.5 \times 10^{17}$ cm$^{-3}$ or lower in the substrate is necessary in order to maintain a substrate resistivity of at least 100 Ωcm after the low-temperature heat treatment.

On the other hand, a SIMOX substrate employs an atmosphere with considerable oxygen during the high-temperature heat treatment step of the manufacturing process, and therefore the oxygen concentration in the substrate varies according to the solubility limit at the treatment temperature. The relationship between the oxygen solubility limit in single crystal silicon and the temperature is shown in FIG. 3 (J. C. Mikkelsen, Jr., THE DIFFUSIVITY AND SOLUBILITY OF OXYGEN IN SILICON, p. 19–30, Materials Research Society (1986)), indicating that the solubility limit increases with increasing temperature, reaching $1.0 \times 10^{18}$ cm$^{-3}$ or greater at temperatures of 1300° C. and above which are normally used for high-temperature heat treatment in SIMOX substrate fabrication. Consequently, the oxygen concentration of the SIMOX substrate varies close to the solubility limit at a given temperature during heat treatment, regardless of the oxygen concentration of the material substrate. On the other hand, since the oxygen solid solution limit falls with decreasing temperature, providing a step of maintaining a temperature lowered from the maximum treatment temperature at the final stage of high-temperature heat treatment will make it possible to reduce the treatment time as well as the oxygen concentration near the solubility limit at the maintained temperature, as during the high-temperature heat treatment described above. Since 1250° C. is the approximate temperature at which the oxygen solubility limit in single crystal silicon is $7.5 \times 10^{17}$ cm$^{-3}$, providing a step of maintaining a temperature of 1250° C. or below for a prescribed time at the final stage of high-temperature heat treatment will render it possible to keep the oxygen concentration of the SIMOX substrate $7.5 \times 10^{17}$ cm$^{-3}$ or lower. More effectively, the temperature is preferably kept at no higher than 1200° C. The degree of reduction in the oxygen concentration is determined by the product of the diffusion length of the oxygen dissolved in silicon at the holding temperature, and the holding time. Considering the diffusion length at 1250° C., the holding time is preferably 4 hours or longer, but from the standpoint of economy, the treatment time is preferably no longer than a maximum of 20 hours. Also, since a lower holding temperature reduces the oxygen solid solution limit, this is preferred for a lower oxygen concentration, but on the other hand, the diffusion length of the solid-dissolved oxygen also decreases, such that the holding time must therefore be lengthened. For this reason, the lower limit for the holding temperature is preferably 800° C.

The atmosphere for the aforementioned step established as the final stage of the high-temperature heat treatment is not particularly restricted, as in the other steps of the high-temperature heat treatment, and it may be an inert gas such as argon or nitrogen, or alternatively oxygen, hydrogen or a mixed gas of argon/oxygen or nitrogen/oxygen.

The apparatus used to carry out the high-temperature heat treatment is not particularly restricted so long as it can accomplish heat treatment at the prescribed temperature for the prescribed period of time. A high-temperature heat treatment furnace may be mentioned as a preferred typical apparatus, but so long as the functions of treatment temperature and treatment time are satisfied, the treatment may even be carried out with a lamp annealing furnace. The conditions in the heat treatment furnace other than the treatment temperature and treatment time, for example, the stand-by temperature, temperature ramp up and down rates, etc. are not particularly restricted, and the temperature ramp up and down conditions may also vary in stages.

EXAMPLE

The present invention will now be explained in further detail through the following example.

Single crystal silicon samples were produced by the Czochralski process, one with the impurity concentration controlled to $1\times10^{14}$ cm$^{-3}$ or lower and another with it controlled to $2\times10^{13}$ cm$^{-3}$ or lower. Each of the crystals was then worked to fabricate an 8-inch (200 mm) diameter single crystal silicon substrate. When the resistivity of the silicon substrate immediately after fabrication was measured from the back side using the 4-point probe method, the resistivity of the substrate worked from the first crystal was 100 Ωcm, and the resistivity of the substrate worked from the other crystal was 500 Ωcm. The oxygen concentration was measured with a Fourier transform infrared spectrometer and found to be $8.5\times10^{17}$ cm$^{-3}$ in both substrates.

Next, two of each silicon substrate were prepared, for a total of 4 substrates, which were subjected to oxygen ion implantation at a substrate temperature of 550° C., an acceleration energy of 180 keV and an implantation dose of $4\times10^{17}$ cm$^{-2}$. Pairs of the two substrates worked from different crystals were each inserted into a high-temperature heat treatment furnace for heat treatment. The first pair of samples A and B were heat treated for 6 hours at a temperature of 1350° C. in an argon atmosphere with an oxygen partial pressure of 0.5%, after which the temperature was lowered to 800° C. at a rate of 5° C./min before removal from the furnace. The second pair of samples C and D were heat treated for 6 hours at the same temperature of 1350° C. in the same atmosphere, after which the temperature was lowered to 1250° C. at a rate of 5° C./min and kept at that temperature for 4 hours. The temperature was then lowered to 800° C. at a rate of 5° C./min before removal from the furnace. From the SIMOX substrate removed from the heat treatment furnace, the surface thermal oxide film was removed using a dilute hydrofluoric acid solution. When each layer thickness was then evaluated by spectroscopic ellipsometry, samples A and B were found to have a surface silicon layer thickness of 340 nm and a buried oxide layer thickness of 85 nm, while samples C and D were both found to have such thicknesses of 330 nm and 85 nm, respectively. When the resistivities of the SIMOX substrates were measured from the back side using the 4-point probe method, the values for samples A and C were 100 Ωcm and the values for samples B and D were 500 Ωcm, as for the material substrates.

Next, all of the SIMOX substrates were again inserted into the heat treatment furnace and subjected to 1 hour of heat treatment at 450° C. in a nitrogen atmosphere containing 4% hydrogen. When the resistivities of the substrates removed from the heat treatment furnace were measured from the back sides using the 4-point probe method, it was confirmed that the resistivities of samples A and B had been lowered to 50 Ωcm, while the resistivity of sample C was 100 Ωcm and that of sample D was 500 Ωcm, i.e., these both maintained high resistivity.

The results are summarized in Table 1.

TABLE 1

| Sample | Resistivity according to 4-point probe measurement (Ω cm) | | Note |
|---|---|---|---|
| | Before hydrogen sintering | After hydrogen sintering | |
| A | 100 | 50 | Comp. Ex.1 |
| B | 500 | 50 | Comp. Ex.2 |
| C | 100 | 100 | Example 1 |
| D | 500 | 500 | Example 2 |

Industrial Applicability

As explained above, the present invention provides a high-resistance SOI substrate which has satisfactory quality and exhibits high substrate resistivity even after low-temperature heat treatment applied in device fabrication steps, by means such that the high-temperature heat treatment conditions are specified during manufacture of the SIMOX substrate using a single crystal silicon substrate with high resistivity.

What is claimed is:

1. A process for fabrication of a SIMOX substrate wherein oxygen ions are implanted into a single crystal silicon substrate which has been produced by the Czochralski process and then subjected to a high-temperature heat treatment at 1300° C. or higher to form a buried oxide layer and a surface single crystal silicon layer, wherein the single crystal silicon substrate used has a mean resistivity of at least 100 Ωcm and no greater than the intrinsic resistivity of the single crystal silicon, and there is conducted a step of maintaining a temperature of from 800° C. to 1250° C. for a predetermined time in the final stage of the high-temperature heat treatment.

2. The process for fabrication of a SIMOX substrate according to claim 1, characterized in that said temperature maintained in the final stage of the high-temperature heat treatment is from 800° C. to 1200° C.

3. The process for fabrication of a SIMOX substrate according to claim 1, characterized in that the time period for maintaining said temperature in the final stage of the high-temperature heat treatment is 4 hours or longer.

4. The process for fabrication of a SIMOX substrate according to claim 1, characterized in that the single crystal silicon substrate used has a mean resistivity of at least 500 Ωcm and no greater than the true resistivity of the single crystal silicon.

5. A SIMOX substrate fabricated by the process according to claim 1, characterized in that the mean resistivity of the substrate section after a low-temperature heat treatment of said SIMOX substrate at 450° C. is at least 100 Ωcm and no greater than the true resistivity of the single crystal silicon.

6. A SIMOX substrate fabricated by a process according to claim 4, characterized in that the mean resistivity of the substrate section after a low-temperature heat treatment of said SIMOX substrate at 450° C. is at least 500 Ωcm and no greater than the true resistivity of the single crystal silicon.

* * * * *